United States Patent
Chang

(10) Patent No.: US 8,158,890 B1
(45) Date of Patent: Apr. 17, 2012

(54) METHOD AND APPARATUS FOR LOW INDUCTIVE DESIGN PATTERN

(75) Inventor: Li-Tien Chang, Taipei (TW)

(73) Assignee: Altera Corporation, San Jose, CA (US)

( * ) Notice: Subject to any disclaimer, the term of this patent is extended or adjusted under 35 U.S.C. 154(b) by 1061 days.

(21) Appl. No.: 12/034,353

(22) Filed: Feb. 20, 2008

(51) Int. Cl.
*H05K 1/11* (2006.01)
(52) U.S. Cl. .................................. 174/262; 174/260
(58) Field of Classification Search ............... None
See application file for complete search history.

(56) References Cited

U.S. PATENT DOCUMENTS

| | | | | |
|---|---|---|---|---|
| 5,161,086 A | * | 11/1992 | Howard et al. | 361/321.1 |
| 5,886,406 A | * | 3/1999 | Bhansali | 257/698 |
| 7,075,185 B2 | * | 7/2006 | Nelson et al. | 257/774 |
| 7,773,390 B2 | * | 8/2010 | Weir et al. | 361/794 |

* cited by examiner

*Primary Examiner* — Ishwarbhai Patel
(74) *Attorney, Agent, or Firm* — Womble Carlyle Sandridge & Rice LLP

(57) ABSTRACT

Provided is an interleaved or wavy spatial arrangement of the micro-vias providing the electrical pathways for the power and ground leads are described. The spatial arrangement increases the coupling pairs between power and ground vias or leads. This spatial arrangement is maintained even as the micro-vias transition across a plane from a direction of travel. Thus, the charge from the decoupling capacitor is able to more efficiently be delivered as the inductances are minimized through this design.

17 Claims, 5 Drawing Sheets

METHOD AND APPARATUS FOR LOW INDUCTIVE DESIGN PATTERN

BACKGROUND

Packaging configurations for semiconductor circuits typically include mounting of the die having the integrated circuit to a substrate, which in turn is mounted onto a printed circuit board or another substrate. Decoupling capacitors provide a momentary charge to compensate when active devices change current consumption. This momentarily stabilizes the current fluctuation caused by the changing current consumption of the integrated circuit, thereby attenuating impedance fluctuations caused by the varying current consumption. The charge in the decoupling capacitors is replenished from the power supply that is connected between each power plane and ground. As packaging substrates are becoming more complex due to the increasing complexity and the miniaturization of the integrated circuits affixed to the packaging substrates, the charge released by the decoupling capacitor takes longer to reach its ultimate destination or device due to the increased inductance from the power/ground connections.

Thus, there is a need for an improved architecture that accelerates the charge released by the decoupling capacitor to a desired destination.

SUMMARY OF THE INVENTION

Broadly speaking, the present invention fills these needs by providing a spatial arrangement that minimizes inductance for the packaging substrate. It should be appreciated that the present invention can be implemented in numerous ways, including as a method, a system, or an apparatus. Several inventive embodiments of the present invention are described below.

In one aspect of the invention, an interleaved or wavy spatial arrangement of the micro-vias providing the electrical pathways for the power and ground leads are described. The spatial arrangement increases the coupling pairs between power and ground vias or leads. This spatial arrangement is maintained even as the micro-vias transition across a plane from a direction of travel. That is, since the micro-vias cannot be stacked vertically on the same axis the entire width of the packaging substrate due to manufacturing constraints, the axis of travel through the substrate transitions within a conductive plane. Even with this transition, the interleaved or wavy spatial arrangement is maintained. Thus, the charge from the decoupling capacitor is able to more efficiently be delivered as the inductances are minimized through this design.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention can be best understood by reference to the following description taken in conjunction with the accompanying figures, in which like parts may be referred to by like numerals.

DETAILED DESCRIPTION OF THE INVENTION

Figure 1:
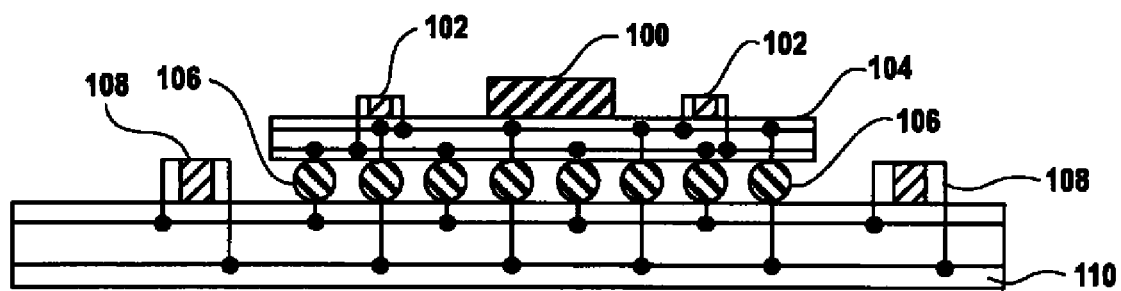
FIG. 1 is a simplified schematic diagram illustrating a packaging configuration in accordance with one embodiment of the invention.

The embodiments described herein discuss interleaving power and ground planes so that micro via patterns can be interleaved accordingly in order to enable the charge released by the capacitor to reach the device quickly and effectively. It will be obvious, however, to one skilled in the art, that the present invention may be practiced without some or all of these specific details. In other instances, well known process operations have not been described in detail in order not to unnecessarily obscure the present invention.

The embodiments described herein provide for interleaving micro-vias within a package substrate in order for a charge to reach the device more quickly. This interleaving increases the coupling between the power and ground vias so as to increase the coupling pairs of the power and ground vias. The interleaving, or disposing of adjacent pairs between each other as described below, enables a reduction in the inductance therebetween. Thus, through the embodiments described herein, the ground and power vias are as close as possible so that there is a maximum shared surface area between the corresponding pairs. The application of micro-vias to the packaging substrate are limited to drilling through two layers at a time due to the material used for the packaging substrate and the nature of the micro-vias. As the package substrate typically has 4 or more layers on each side of a core, the layout of the micro-vias has an impact on the performance of the signal integrity and performance through the package substrate. In the embodiments described below the position of the micro-vias for respective power and ground connections are manipulated to reduce the inductance for the signal pathways to enhance the signal delivery from the decoupling capacitor for the package substrate.

As the operational frequency and integration increases, the overall performance of electronic systems becomes increasingly sensitive to the capacitive, inductive, and resistive characteristics of the integrated circuits. The structure employed to interconnect the integrated circuits may result in unwanted currents propagating along either a direct current power trace, or a signal trace that degrades the operation of the integrated circuit. For example, during operation, the amount of current demand of an integrated circuit such as a processor, ASIC or PLD, can vary rapidly between milliamps to tens of amps. This may produce voltage in the power plane through which current is applied to the integrated circuit. The magnitude of the spikes are proportional to the frequency of operation of the integrated circuit. This produces a voltage drop across the inductance associated with the power planes in direct proportion to the rate of change of current. This voltage drop may substantially reduce the operational frequency of the integrated circuit. Accordingly, the embodiments described herein provide a technique for reducing surge currents without increasing the area required to form the integrated circuit or reduce the operational frequency.

FIG. 1 is a simplified schematic diagram illustrating a packaging configuration in accordance with one embodiment of the invention. Die 100 is disposed on packaging substrate 104. Packaging substrate 104 includes decoupling capacitors 102 in order to provide a charge under conditions where the charge from the capacitor is needed to provide a stable current or voltage. Packaging substrate 104 includes an interleaved pattern of ground and plane vias in order to reduce inductance so that the charge from the decoupling capacitors 102 may be delivered in an expedient and effective fashion. The interleaved or wavy pattern of power and ground vias within packaging substrate 104 are discussed in more detail below. It should be noted that the vias are micro-vias in one embodiment. Packaging substrate 104 is part of a flip chip package in one embodiment where bumps 106 provide contacts to a printed circuit board 110 disposed there below. Printed circuit board 110 may also include decoupling capacitors 108 in order to effectively provide signal pathways and maintain signal integrity within printed circuit board 110. It should be appreciated that die 100 may be any integrated circuit, such as a processor, application specific integrated circuit (ASIC), a programmable logic device (PLD), etc. Packaging substrate 104 may include multiple layers symmetrically disposed around a core as will be described in further detail below. The materials utilized for packaging substrate 104 tend not to be capable of being etched straight through the multiple layers. Thus, the connection between the decoupling capacitors 102 and the various layers must traverse between the different layers of packaging substrate 104 as the packaging substrate is not amenable to drilling straight through or stacking multiple micro-vias directly on top of each other. The embodiments described herein describe details of the location and placement, i.e., spatial relationship, of the micro vias providing the connections between the different layers within packaging substrate 104 in a manner to minimize inductance.

Figure 2A:
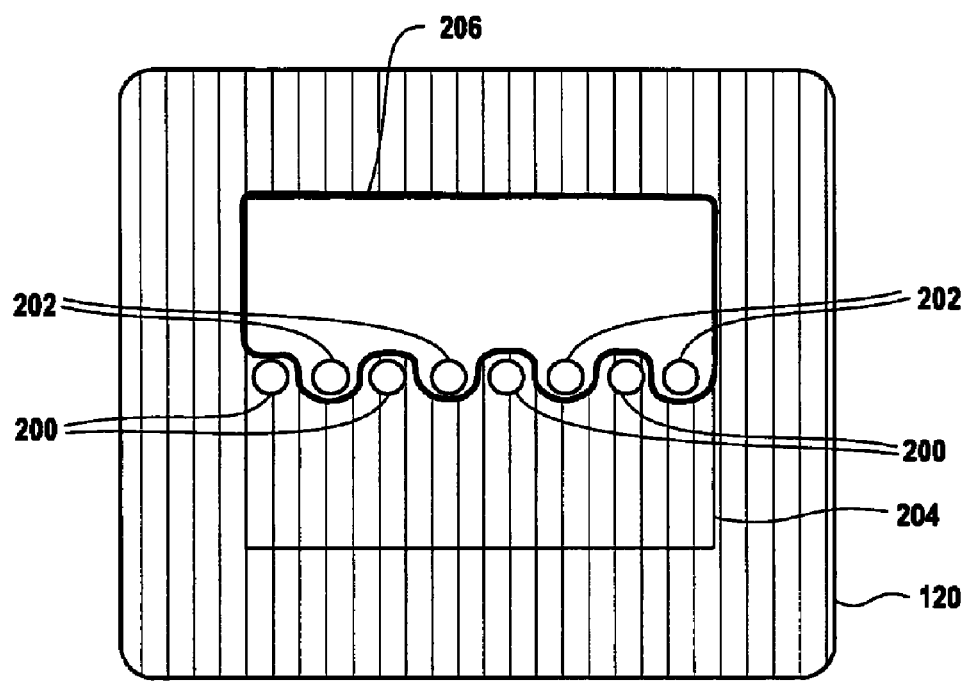
FIG. 2A is a simplified schematic diagram illustrating a top layer view of an interleaved or wavy pattern for power and ground planes in accordance with one embodiment of the invention.

FIG. 2A is a simplified schematic diagram illustrating a top layer view of an interleaved or wavy pattern for power and ground planes in accordance with one embodiment of the invention. In this embodiment, there are four ground vias 200 interleaved with four power vias 202. As illustrated in FIG. 2A, top layer 120 provides a power island 206 surrounded by the ground plane 204. It should be appreciated that the power island 206 is isolated from ground plane 204 by an insulator disposed there between.

Figure 2B:
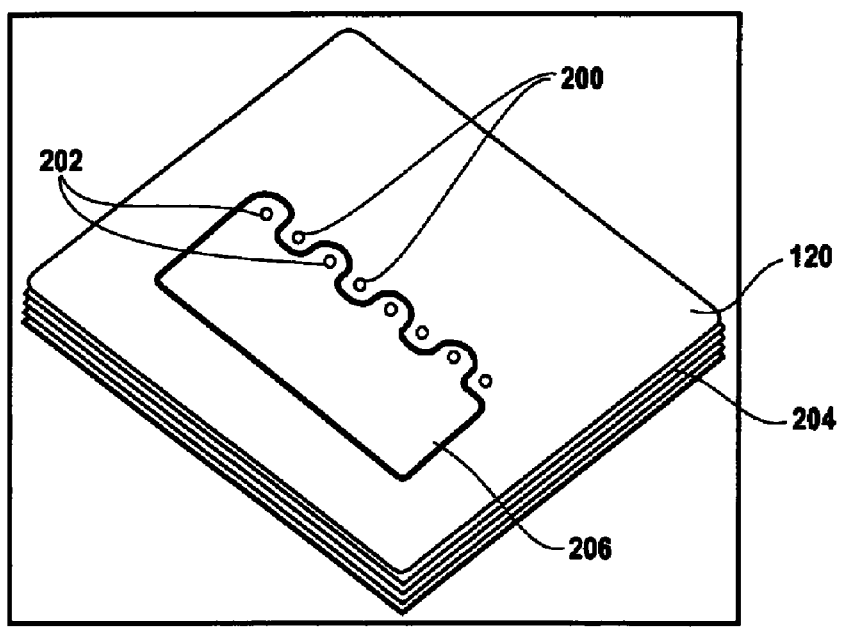
FIG. 2B is a simplified schematic diagram illustrating a perspective view of a power island disposed within a ground plane of a top layer of the packaging substrate in accordance with one embodiment of the invention.

FIG. 2B is a simplified schematic diagram illustrating a perspective view of power island 206 disposed within ground plane 204 of top layer 120. Interconnects 200 and 202 for corresponding ground and power vias, respectively, are illustrated thereon. As depicted in FIG. 2B, top layer 120 is disposed over a plurality of layers within the packaging substrate and separated thereon by insulating layers. A bottom layer of the packaging substrate portion in this embodiment is a power plane while all the intermediate layers may be ground planes. It should be appreciated that each of the layers are composed of a conductive metal and separated through insulating layers commonly used for packaging substrates.

Figure 2C:
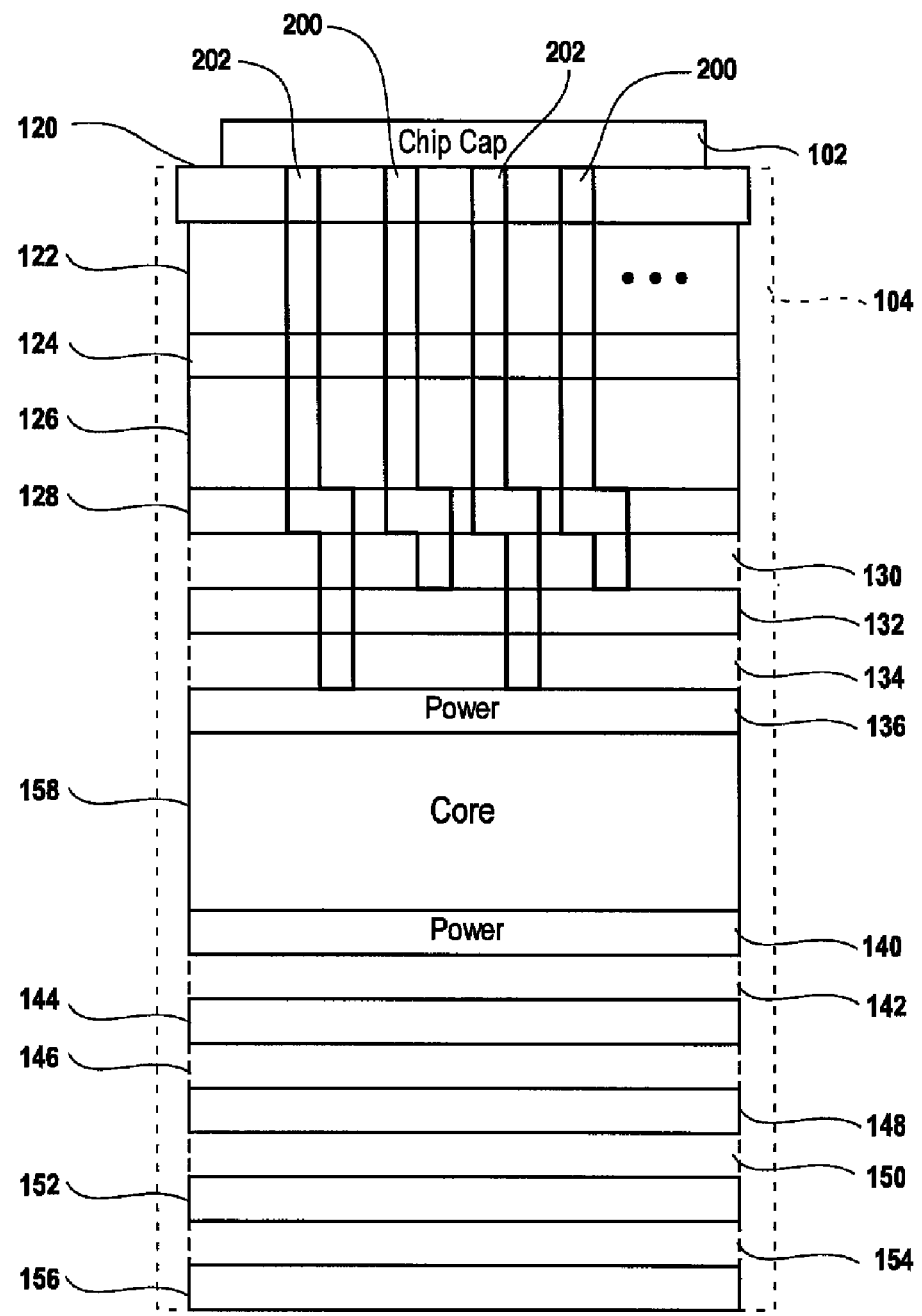
FIG. 2C is a simplified schematic diagram showing a cross-sectional view of the interleaved pattern for the power and ground vias in accordance with one embodiment of the invention.

FIG. 2C is a simplified schematic diagram showing a cross-sectional view of the interleaved pattern for the power and ground vias in accordance with one embodiment of the invention. Chip capacitor 102 is disposed on top layer 120 of packaging substrate 104. Packaging substrate 104, which may be referred to as a build-up substrate, includes a plurality of layers symmetrically disposed around core 158. A top portion of packaging substrate 104 includes layers 120 through 136, while a bottom portion of packaging substrate 104 includes layers 140 through 156. Layers 136 and 140 are disposed on opposing sides of core 158 and function as power planes. Layers 120, 124, 128, 132, 144, 148, 152 and 156 function as ground planes. In this embodiment, a four-two-four configuration is provided with four ground planes on each side of core 158 and two power planes on each side of the core. Thus, in this embodiment, each side of the core includes five layers of either a power or a ground plane combination. Of course, other configurations commonly used for packaging substrates, such as there-two-three configurations may be used with embodiments described herein also. Power and ground vias 202, and 200, respectively, are defined between the corresponding layers and core 158. As mentioned above, the micro vias are typically only able to proceed through one or two planes or layers, i.e., ground planes, therefore the transition between the various layers is mirrored so that the spatial relationship for the wavy and interleaving pattern is maintained through the various layers. Power vias 202 transition in layer 126 to an adjacent location in order to proceed to power plane 136. Ground vias 200 follow this same pattern in an interleaved fashion and proceed to layer 132 so that the interleaving of the power and ground vias minimize inductance introduced through the interconnects. It should be appreciated that FIG. 2C illustrates that the direction of travel for the ground and power vias transitions at layer 126 and then proceed along a different axis through the lower portion of the plurality of layers as compared to the axis of travel through the upper portion. In one embodiment, the vias are moved over one via width. That is, if the upper and lower portions of the vias were extended vertically, the extensions would be adjacent to the portion of the via from which the extensions emanated from.

Figure 3A:
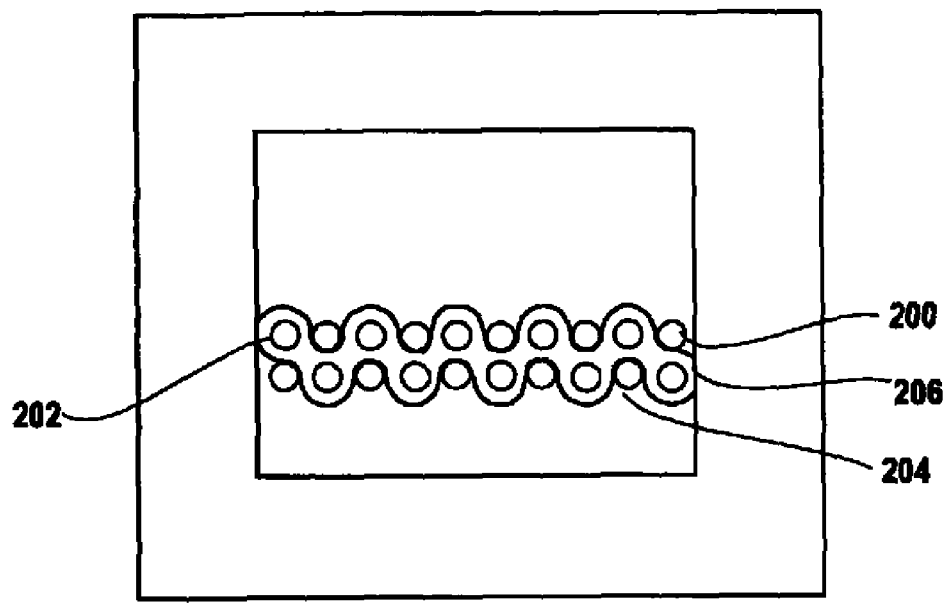
FIGS. 3A and 3B illustrate yet one other pattern for interleaving the power and ground vias in accordance with one embodiment of the invention.
Figure 3B:
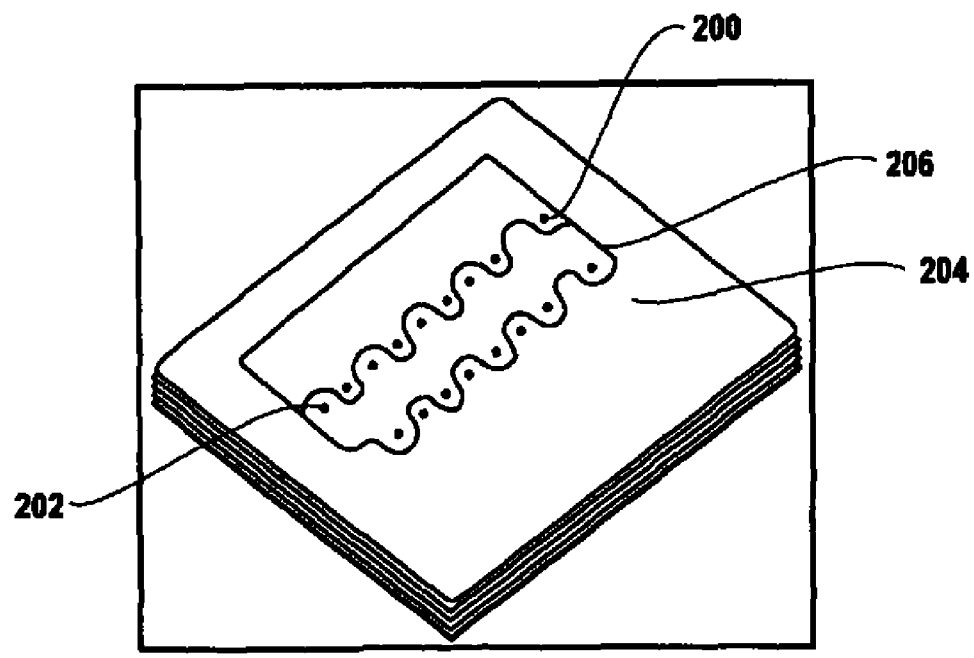

FIGS. 3A and 3B illustrate yet one other pattern for interleaving the power and ground vias in accordance with one embodiment of the invention. In FIG. 3A, power island 206 is disposed within ground plane 204. Of course, power island 206 is isolated from ground plane 204 through appropriate insulators. Two rows of interleaved vias are illustrated with power vias 202 defined in an interleaved pattern with ground vias 200. FIG. 3B illustrates a perspective view of a top layer disposed over multiple lower layers in accordance with one embodiment of the invention.

Figure 4A:
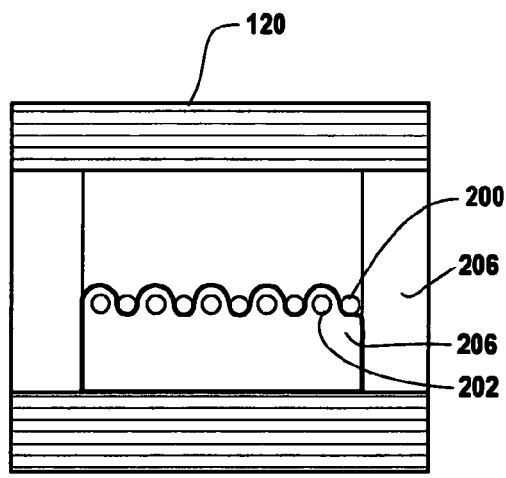
FIGS. 4A through 4D are simplified schematic diagrams illustrating an interleaved or wavy pattern of ground and power vias in accordance with one embodiment of the invention.
Figure 4B:
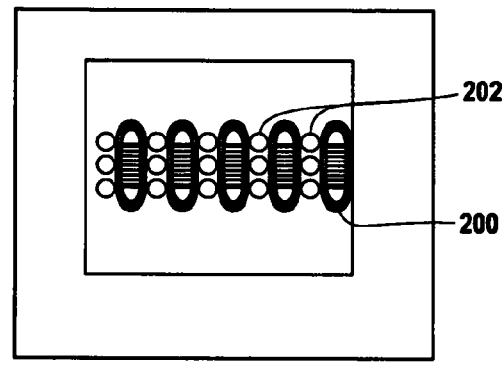
Figure 4C:
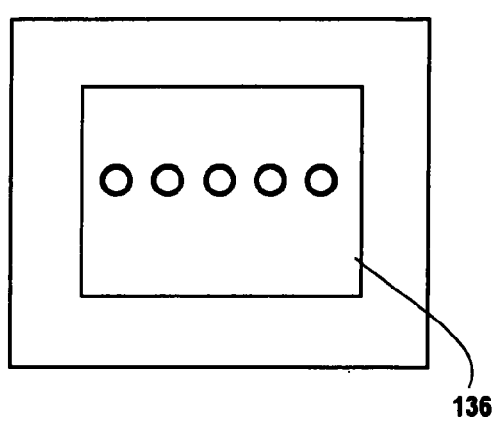
Figure 4D:
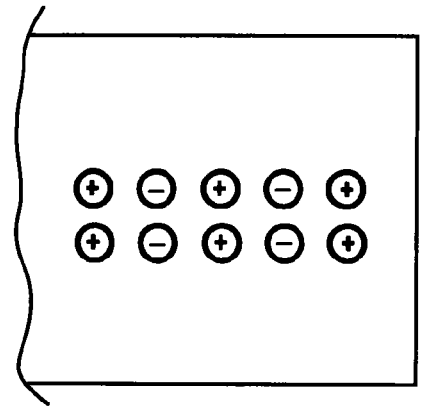

FIGS. 4A through 4D are simplified schematic diagrams illustrating an interleaved or wavy pattern of ground and power vias in accordance with one embodiment of the invention. In this embodiment, four pairs of ground and power vias are interleaved in the pattern illustrated. Ground vias 200 are disposed between power vias 202 in adjacent pairs in order to encourage cross coupling between the adjacent pairs. FIG. 4B illustrates a top view of layers two through four below top layer 120 of FIG. 4A. Within FIG. 4B, power vias 202 are illustrated having a transition within layer three as illustrated with reference to FIG. 2C. Ground vias 200 will illustrate the same transition pattern within layer three of FIG. 4B in order to provide a great degree of cross coupling. Bottom layer 136 is illustrated having the connections to the power plane. FIG. 4D is a simplified schematic diagram illustrating a conceptual diagram of the interleaved power and ground vias in accordance with one embodiment of the invention. As illustrated, each ground via can cross couple with a power via that the ground via is paired with and an adjacent power via from an adjacent pair of power and ground vias. It should be appreciated that numerous other patterns may be applied with pairs of ground and power vias adjacent to each other through a wavy interleaved pattern where a single row of vias is utilized or multiple adjacent rows are utilized. Thus, the embodiments described herein are not meant to be restrictive to exclude these patterns.

In summary, the above-described invention provides a design for a packaging substrate to enhance the charge supplied by a capacitor of the packaging substrate. It should be appreciated that the embodiments may be applied to any integrated circuit package including packages for processors, ASICs, and PLDs. In one embodiment, the programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A packaging substrate, comprising:
   a plurality of layers, wherein layers of said plurality of layers are disposed over each other on opposing sides of a core;
   a decoupling capacitor disposed on a top surface of a top layer of the packaging substrate; and
   a first pair of vias and a second pair of vias, each of the first and second pairs including a first via type and a second via type traversing the plurality of layers from the top layer to a power supply plane affixed to the core, wherein the first via type of the first pair is disposed between the second via type of the first pair and the second via type of the second pair, and wherein each via type of the first and second pairs traversing the plurality of layers transition from a first axis of a top portion of the plurality layers to a second axis of a bottom portion of the plurality layers.

2. The packaging substrate of claim 1, wherein each of the first and second pairs of vias maintain a spatial relationship in the top portion and the bottom portion.

3. The packaging substrate of claim 1, wherein the first and second via types are micro-vias.

4. The packaging substrate of claim 1, wherein the first via type is tied to a power supply and the second via type is tied to ground.

5. The packaging substrate of claim 1, wherein the first and second pairs of vias supply power and ground connections to the decoupling capacitor.

6. The packaging substrate of claim 1, wherein the packaging substrate is disposed between an integrated circuit within a flip chip package and printed circuit board.

7. A packaging substrate for interfacing with a semiconductor device, comprising:
   a core;
   a plurality of layers, wherein layers of said plurality of layers are superimposed over each other, with a power supply layer affixed to the core, wherein a top layer of the plurality of layers includes a capacitor disposed thereon, wherein the capacitor is in electrical communication with the power supply layer; and
   a first pair of micro-vias adjacent to and disposed between second and third pairs of micro-vias, wherein each of the pairs maintain a spatial relationship through the plurality of layers, such that power and ground vias of each of the pairs are interleaved through the plurality of layers, and wherein each of the pairs of micro-vias transition from a first axis through the packaging substrate to a second axis through the packaging substrate across a portion of one of the plurality of layers.

8. The packaging substrate of claim 7, wherein the plurality of layers above the power supply layer are ground planes.

9. The packaging substrate of claim 7, wherein an insulating layer separates each of the plurality of layers.

10. The packaging substrate of claim 7, wherein the packaging substrate includes multiple capacitors.

11. The packaging substrate of claim 7, wherein the packaging substrate includes another plurality of layers, wherein layers of said another plurality of layers are stacked over an opposing side of the core from the plurality of layers.

12. The packaging substrate of claim 7, wherein the packaging substrate is disposed between an integrated circuit within a flip chip package and printed circuit board.

13. A package substrate for interfacing with a semiconductor device, comprising:
   a core;
   a first plurality of layers disposed over a first surface of the core, wherein layers of said plurality of layers are superimposed over each other, with a power supply layer affixed to the core, wherein a top layer of the plurality of layers includes a capacitor disposed thereon, wherein the capacitor is in electrical communication with the power supply layer;
   a first pair of micro-vias adjacent to and disposed between second and third pairs of micro-vias, wherein each of the pairs maintain a spatial relationship through the plurality of layers, such that power and ground vias of each of the pairs are interleaved through the plurality of layers, and wherein each of the pairs of micro-vias transition from a first axis through the packaging substrate to a second axis through the packaging substrate across a portion of one of the plurality of layers; and
   a second plurality of layers disposed over a second surface of the core, the second surface of the core opposing the first surface.

14. The package substrate of claim 13, wherein a layer above the power supply layer is a ground plane.

15. The package substrate of claim 13, wherein an insulating layer separates each of the first plurality of layers.

16. The package substrate of claim 13, wherein the package substrate includes multiple capacitors.

17. The package substrate of claim 13, wherein the package substrate is disposed between an integrated circuit within a flip chip package and printed circuit board.

* * * * *